(12) United States Patent
Egerton et al.

(10) Patent No.: US 10,297,700 B1
(45) Date of Patent: May 21, 2019

(54) THERMAL DETECTORS USING GRAPHENE AND OXIDES OF GRAPHENE AND METHODS OF MAKING THE SAME

(71) Applicant: Magnolia Optical Technologies, Inc., Woburn, MA (US)

(72) Inventors: Elwood J. Egerton, Hot Springs, SD (US); Ashok K. Sood, Brookline, MA (US)

(73) Assignee: Magnolia Optical Technologies, Inc., Woburn, MA (US)

( * ) Notice: Subject to any disclaimer, the term of this patent is extended or adjusted under 35 U.S.C. 154(b) by 0 days.

(21) Appl. No.: 15/582,537

(22) Filed: Apr. 28, 2017

Related U.S. Application Data

(60) Division of application No. 14/949,776, filed on Nov. 23, 2015, now abandoned, which is a continuation of application No. 13/870,959, filed on Apr. 25, 2013, now Pat. No. 9,196,766.

(60) Provisional application No. 61/638,243, filed on Apr. 25, 2012.

(51) Int. Cl.
*H01L 31/028* (2006.01)
*G01J 5/20* (2006.01)
*H01L 31/101* (2006.01)

(52) U.S. Cl.
CPC ............ *H01L 31/028* (2013.01); *G01J 5/20* (2013.01); *H01L 31/101* (2013.01)

(58) Field of Classification Search
CPC ............... B82Y 10/00; H01L 51/0048; H01L 2221/1094; H01L 29/1606
See application file for complete search history.

(56) References Cited

U.S. PATENT DOCUMENTS

| | | | |
|---|---|---|---|
| 6,574,130 B2 | 6/2003 | Segal et al. | |
| 6,643,165 B2 | 11/2003 | Segal et al. | |
| 6,706,402 B2 | 3/2004 | Rueckes et al. | |
| 6,784,028 B2 | 8/2004 | Rueckes et al. | |
| 6,835,591 B2 | 12/2004 | Rueckes et al. | |

(Continued)

FOREIGN PATENT DOCUMENTS

WO 0103208 A1 1/2001

OTHER PUBLICATIONS

Ng, "Complete Guide to Semiconductor Devices", 2002, pp. 532-533, Publisher: John Wiley & Sons, Published in: US.

*Primary Examiner* — Kenneth J Malkowski
(74) *Attorney, Agent, or Firm* — Loginov & Associates, PLLC; William A. Loginov

(57) ABSTRACT

Radiation detecting and sensing systems using graphene and methods of making the same are provided; including a substrate, a single or multiple layers of graphene nanoribbons, first and second conducting interconnects each in electrical communication with the graphene layers. Graphene layers are tuned to increase the temperature coefficient of resistance, increasing sensitivity to IR radiation. Absorption over a wide wavelength range (200 nm to 1 mm) is possible based on the three alternative devices structures described within. Devices can variously include (a) a microbolometer based graphene film where the TCR of the layer is enhanced with selected functionalization molecules, (b) graphene layers with a source and drain metal interconnect and a deposited metal of SiO2 gate which modulates the current flow across the phototransistor detector, and/or (c) tuned graphene layers layered on top of each other where a p-type layer and a n-type layer is created using a combination of oxidation and doping.

16 Claims, 5 Drawing Sheets

(56) References Cited

U.S. PATENT DOCUMENTS

| | | |
|---|---|---|
| 6,911,682 B2 | 6/2005 | Rueckes et al. |
| 6,919,592 B2 | 7/2005 | Segal et al. |
| 6,924,538 B2 | 8/2005 | Jaiprakash et al. |
| 7,597,788 B2 | 10/2009 | Visel et al. |
| 7,723,684 B1 | 5/2010 | Haddon et al. |
| 8,916,825 B1 | 12/2014 | Egerton et al. |
| 2007/0086921 A1 | 4/2007 | Visel et al. |
| 2007/0145966 A1 | 6/2007 | Shekhawat et al. |
| 2008/0251723 A1 | 10/2008 | Ward et al. |
| 2009/0115305 A1 | 5/2009 | Segal et al. |
| 2009/0140167 A1 | 6/2009 | Ward et al. |
| 2010/0102292 A1 | 4/2010 | Hiura et al. |
| 2010/0206363 A1 | 8/2010 | Choi |
| 2011/0068290 A1 | 3/2011 | Haddon et al. |
| 2011/0127638 A1 | 6/2011 | Brenner et al. |
| 2013/0075699 A1 | 3/2013 | Brown et al. |
| 2013/0107344 A1 | 5/2013 | Avouris et al. |
| 2013/0256627 A1 | 10/2013 | Jain et al. |

THERMAL DETECTORS USING GRAPHENE AND OXIDES OF GRAPHENE AND METHODS OF MAKING THE SAME

RELATED APPLICATIONS

This application is a divisional of U.S. patent application Ser. No. 14/949,776, filed Nov. 23, 2015, entitled THERMAL DETECTORS USING GRAPHENE AND OXIDES OF GRAPHENE AND METHODS OF MAKING THE SAME, which application is a continuation of U.S. patent application Ser. No. 13/870,959, filed Apr. 25, 2013, entitled THERMAL DETECTORS USING GRAPHENE AND OXIDES OF GRAPHENE AND METHODS OF MAKING THE SAME, now U.S. Pat. No. 9,196,766, issued Nov. 24, 2015, which application claims the benefit of U.S. Provisional Application Ser. No. 61/638,243, filed Apr. 25, 2012, entitled THERMAL DETECTORS USING GRAPHENE AND OXIDES OF GRAPHENE AND METHODS OF MAKING THE SAME, the entire disclosures of each of which applications is herein incorporated by reference.

FIELD OF THE INVENTION

The present application relates generally to bundled nanotube fabrics and methods of making graphene for use in Ultraviolet (UV), Infrared (IR) and Terahertz radiation detecting and sensing systems.

BACKGROUND OF THE INVENTION

Photodetectors are an integral part of optical circuits and components (for example emitters, modulators, repeaters, waveguides or fibers, reflectors, resonators, detectors, IR Focal plane arrays, UV microchannel arrays and THZ diode detectors etc.) and are used for the sensing of electromagnetic radiation. There are several approaches to these devices. Photoconducting materials, typically semiconductors, have electrical properties that vary when exposed to electromagnetic radiation (i.e. light). One type of photoconductivity arises from the generation of mobile carriers (electrons or holes) during absorption of photons. For semiconducting materials, the absorption of a specific wavelength of light, hence photon energy, is directly proportional to the band gap of the material ($E_g$=hn=hc/l, where $E_g$ is the materials band gap, h is Plank's constant ($4.136 \times 10^{-15}$ eVs), c is the speed of light in a vacuum ($2.998 \times 10^{10}$ cm/s) and l is the wavelength of the radiation). If the band gap energy is measured in eV (electron Volts) and the wavelength in micrometers, the above equation reduces to $E_g$=1.24/l. A photodiode (i.e. p-n diode, p-i-n photodiode, avalanche photodiode, etc.) is the most commonly employed type of photoconductor.

Light detection is ideally suited for direct band gap semiconductors such as Ge and GaAs. However, indirect band gap semiconductors (where an additional phonon energy is needed to excite an electron from the valence band to the conduction band), such as Silicon, are also used as photodetectors. A widely known type of photodetectors is the solar cell, which uses a simple p-n diode or Schottky barrier to detect impinging photons. Besides silicon, most photodetectors disadvantageously do not integrate with existing microelectronics technology, usually detect only a specific wavelength (i.e. 1.1 mm for Si, 0.87 mm for GaAs, 0.414 mm for a-SiC and 1.89 mm for Ge), and require multiple detectors to detect a broad band of wavelengths (hence photon energy).

Besides photodiodes, there are other types of photodetectors that do not rely on the generation of current through the excitation of electrons (or holes). One type of detector is the bolometer. Bolometers operate by absorbing radiation, which in turn raises the temperature of the material and hence alters the resistance of the material. For useful background information on bolometers and semiconductor devices, refer to Kwok K. NG, "Complete Guide to Semiconductor Devices," IEEE Press, John Wiley & Sons, 2002, pages 532-533. Bolometers can be constructed from metallic, metallic-oxides or semiconducting materials such as vanadium oxide and amorphous silicon. Since bolometers detect a broad range of radiation above a few microns, bolometers are typically thermally stabilized to reduce the possibility of detection of blackbody radiation that is emitted from the detector material, which leads to a high background noise. Unlike other detector technologies, IR microbolometer detectors and arrays advantageously do not require cooling to cryogenic temperatures unlike the other detector technologies discussed.

Graphene by the use of oxidation processing can induce a band gap in graphene layers. Since graphene can also generate heat and phonons by several processes (injection of electrons, impinging with radiation, etc.), graphene is also ideally suited as an IR detector. For graphene, which has a zero electron volt bandgap, high mobilities (approximately 100000 cm2/Vs) and carrier saturation velocities on the order of approximately 5×10E7 cm/s, these nanoribbons can serve as either photodetectors or by modulation of the temperature coefficient of resistance of the graphene layer(s), a microbolometer type of detector.

An existing prior art micro bolometer utilizes vanadium oxide as the element which changes impedance for incoming IR radiation. Typically 2% per degree C. is the highest thermal coefficient of resistance achievable. This performance is limited by 1/f noise and the basic physical properties of the vanadium oxide film. The VOx based micro bolometer is fabricated on top of the CMOS readout circuit, which provides a cost benefit.

Accordingly, it is desirable to provide graphene based UI, IR and THZ radiation and light detecting systems to enhance overall sensitivity of the system.

SUMMARY OF THE INVENTION

The present invention overcomes the disadvantages of the prior art by providing a light detector that includes a single graphene layer (or multiple layered) article in electrical communication with a first and a second contact; and a detection circuit in electrical communication with the first and second contacts. The detection circuit provides electrical outputs for sufficient light detection from the nanotube article in the proximity of the predefined region by use of preamplification.

In accordance with an illustrative embodiment, the predefined region where graphene layer(s) are situated on a cantilever beam that provides thermal isolation from the surrounding environment.

In accordance with an illustrative embodiment, graphene is deposited and is exposed to an oxidation environment resulting in the creation of a bandgap in the graphene layer. With the introduction of n or p dopants, a n-on-p or p-on-n photodiode is fabricated.

In accordance with an illustrative embodiment, the predefined region is between two electrical contacts. These electrical contacts provide electrical communication and also are designed for maximum thermal isolation. Additionally, in order to create low electrical resistance graphene to interconnect connection, the use of Palladium or platinum is desirable to enhance pi bond connects in the graphene phase and the metal interconnects.

In accordance with an illustrative embodiment, the graphene based detector invention light detection arrays can be integrated with semiconductor circuits including CMOS circuits which provide pixel array x-y controls, pre-amplification of the modulated resistance signal from the IR detector and the conversion of the analog signal to digital.

In accordance with an illustrative embodiment, the graphene nanoribbon film(s) increase the temperature coefficient of resistance from existing prior art of approximately 0.025% per degree Centigrade to in excess of approximately 0.04% per degree centigrade.

In accordance with an illustrative embodiment, a graphene based microbolometer detects light by resistance changes in the fabric due to heating.

In accordance with an illustrative embodiment, the IR detector no longer suffers from the Nyquist frequency limitation. This is due to the fact that the Nyquist frequency limitation is due to the presence of 1/f or flicker noise. Graphene nanoribbons exhibit non measurable noise sources of these types. Within optical systems with f1, the elimination of Nyquist limited behavior is a vast improvement to IR detection systems performance.

BRIEF DESCRIPTION OF THE DRAWINGS

The invention description below refers to the accompanying drawings, of which.

DETAILED DESCRIPTION

Devices including graphene single layers or multilayers suspended over gaps (for example, gaps of approximately 50-250 nm) can be employed as Infrared (IR) radiation detectors. In addition, the application of graphene single layer or multilayers on a thermally isolated cantilever beam can be employed as an IR radiation detector.

Graphene based detectors have several important and unique features that are not available with existing technologies. First, arrays of these nanotube light detectors can be formed using patterning technology at minimum dimensions of the lithography node used or dictated by the demands of the optical imaging system. It is possible to create 25, 17, or 8 micron square or less detectors limited only by photolithography techniques.

Illustrative embodiments of the invention allow integration at a level of one light detector per ten or less transistors at the minimum dimension of a given lithography node or the integration of large arrays that are addressed by CMOS pre-amplification or readout and logic circuits. Previously only discrete components, such as silicon p-n diodes, could be used as light detectors for optoelectronic circuits. Other types of detectors require complex and difficult fabrication techniques such as flip-chip processes to integrate with silicon semiconductor technology. Because CNT light sensors can be integrated to form VLSI arrays, which allows for optical interconnects having one light detector per transistor (or waveguide, depending on function), the fabrication of ultra-dense optical circuits is possible.

Figure 1:
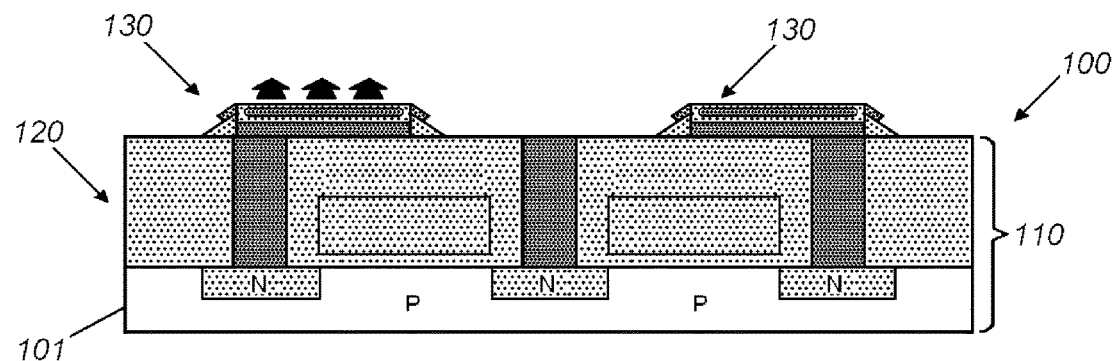
FIG. 1 is a schematic diagram of a microbolometer detecting element according to an illustrative embodiment employing a graphene sensing element fabricated on a generic CMOS wafer process.

According to illustrative embodiments, light detecting elements have a suspended region of nanofabric overlying a substrate material. FIG. 1 shows a schematic diagram of an IR detector having a graphene based fabric sensing element fabricated on a generic CMOS wafer. The IR detector incorporates a graphene based fabric sensing element for performing the infrared detection. The IR detector 100 includes a conventional P-N junction substrate 101, which is part of the overall CMOS logic 110. The substrate 101 can comprise silicon using a Bridgman float zone technique. There is a film 120 deposited on the substrate 101 as well as the graphene nanoribbon IR sensors 130, for performing the IR detection. The film 120 can comprise a silicon oxide layer based upon the absorption frequency for the type of device. The IR detector 101 is fabricated in accordance with the procedures outlined in FIGS. 2A through 2I.

Light detectors can be constructed using suspended or non-suspended nanotube-based fabrics in combination with appropriate substrates. Fabrication techniques to develop such horizontally- and vertically-disposed fabrics and devices composed of nanotube fabrics which comprise redundant conducting nanotubes may be created via CVD, or by room temperature operations as described herein. For useful background material on fabrication of carbon nanotubes, refer to U.S. Pat. No. 6,706,402, and published PCT Application No. WO 01/03208, which are expressly incorporated by reference herein. Because creation of suspended graphene-based detector elements is like fabrication of suspended nanotube-based memory elements described in the incorporated U.S. Pat. No. 6,706,402 and WO 01/03208, reference can be made to these materials for background information on the fabrication of suspended graphene-based detector elements. Such detectors can be part of a scheme involving signal transmission or use in a display.

The substrate material 101 can be an insulator such as one described hereinabove or can be a semiconductor (such as, but not limited to, Si (single crystal, polycrystalline and amorphous), Ge, SiGe, SiC, Diamond, GaN, GaAs, GaP, AlGaAs, InP, GaP, CdTe, AlN, InAs, $Al_xIn_{1-x}P$, and other III-V and II-VI semiconductors) or a conductor (such as, but not limited to, Al, Cu, W, Al(<1% Cu), Co, Ti, Ta, W, Ni, Mo, Pd, Pt, TiW, Ru, $CoSi_x$, $WSi_2$, $TiSi_x$, TaN, TiN, TiAlN, RuN, RuO, PtSi, $Pd_2Si$, $MoSi_2$, $NiSi_x$). The substrate material systems can be chosen for circuitry technologies and light absorption considerations, the graphene fabric and associated microbolometer structure processing are compatible with all of these materials. The suspended region (see region 272 of FIG. 2H) defines the electromagnetic sensing region of the detecting element 100.

Figure 5:
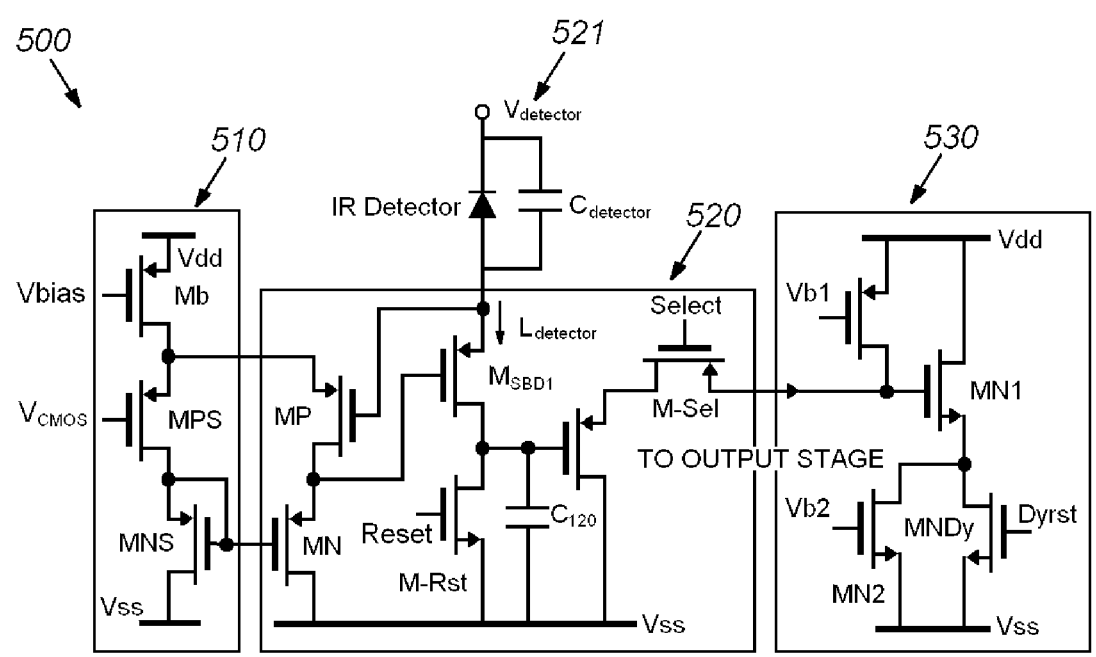
FIG. 5 is a schematic diagram of the CMOS readout circuit for the graphene detector elements, in accordance with the illustrative embodiments.

The layers are composed of several layers of overlapping graphene layers to create a multilayered film of greater than approximately 10 nm. The graphene layer(s) can be grown or deposited on a surface, as described hereinabove, to form a contiguous film of a given density. Typically, the lower dimension sizes of the nanotube film are a consequence of lithographic technology limitations and not any limitations of the illustrative embodiments herein. After patterning, the graphene layers can be further integrated with metal interconnects and dielectric passivation layers to create a circuit element. The light detection from the detecting element 130 is controlled by driving circuitry. Refer to FIG. 5 for a diagram of exemplary driving circuitry 510, 520, 521 and 530.

Light detectors can be constructed using suspended or non-suspended graphene-based fabrics in combination with appropriate substrates. Fabrication techniques to develop such horizontally- and vertically-disposed fabrics and devices composed of nanotube fabrics which comprise redundant conducting graphene can be created via CVD, or by room temperature operations as described herein and others known in the art. Refer, for example, to U.S. Pat. Nos. 6,574,130, 6,643,165, 6,706,402, 6,784,028, 6,835,591, 6,911,682, 6,919,592, and 6,924,538, for useful background information on fabrication of graphene-based fabrics.

Light can be impinged on the open area of these bundled carbon nanotube fabrics to cause the generation of heat in the fabric, such as a bolometer. Or in the case of the phototransistor based photodetectors the absorbed light carriers Suspended graphene layers are ideal structures for monolayered fabrics, which have a high porosity. Since the substrate may influence the detection of radiation, the suspended region should diminish any disadvantageous substrate thermal isolation effects.

Figure 2A:
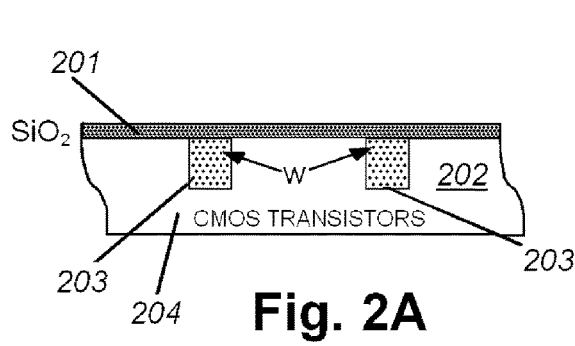
FIG. 2A is a schematic diagram of the resulting structure after a first step is performed in fabrication of a graphene based thermal detector, in which a film is deposited on a substrate and standard photolithography creates a hole over the tungsten (W) plugs, according to the illustrative embodiment.
Figure 2B:
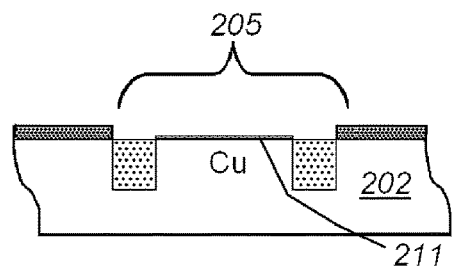
FIG. 2B is a schematic diagram of the resulting structure after another step is performed in the fabrication of the thermal detector, in which a thin film of Cu is deposited, according to the illustrative embodiment.

Reference is now made to FIGS. 2A-2H, showing the various stages of the fabrication procedure for an IR detector incorporating graphene layers. Standard CMOS microelectronics processing techniques, graphene nanoribbon process flow or the CVD (chemical vapor deposition) process can be employed to fabricate the detector in accordance with the illustrative embodiments herein. As shown in FIG. 2A, using standard CMOS microelectronics processing techniques, a deposited silicon oxide film 201 is deposited on the substrate 202. A standard photolithography method, known in the art, is used to create a hole 205 over the tungsten (W) plugs. The Tungsten plugs 203 serve as interconnects to the underlying CMOS pre-amplification circuitry 204. Refer to FIG. 5 for a diagram of an exemplary CMOS circuitry. The next step, as shown in FIG. 2B, is to use electron beam evaporation or direct current sputtering to deposit a thin film of Copper (Cu) 211 which serves as an IR photon reflector.

Figure 2C:
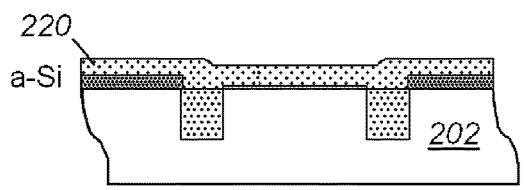
FIG. 2C is a schematic diagram of the resulting structure after another step is performed in the fabrication of the thermal detector, in which a layer of amorphous silicon is deposited, according to the illustrative embodiment.
Figure 2D:
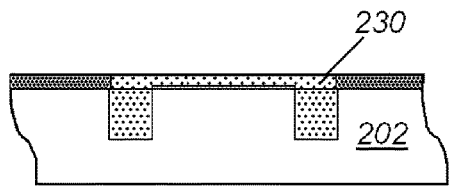
FIG. 2D is a schematic diagram of the resulting structure after another step is performed in the fabrication of the thermal detector, in which the layer of amorphous silicon is planarized using chemical-mechanical polishing, according to the illustrative embodiment.
Figure 2E:
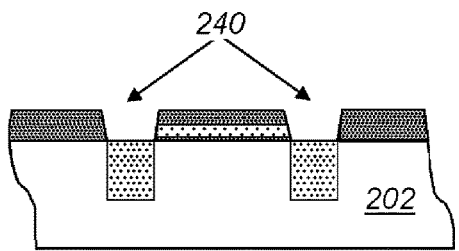
FIG. 2E is a schematic diagram of the resulting structure after another step is performed in the fabrication of the thermal detector, in which contact holes are provided through the amorphous silicon and silicon oxide layers, thereby clearing the material down to the underlying tungsten (W) plus, according to the illustrative embodiment.
Figure 2F:
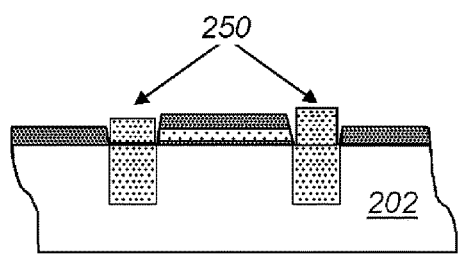
FIG. 2F is a schematic diagram of the resulting structure after another step is performed in the fabrication of the IR detector, in which standard CMOS interconnect metallurgy is deposited, according to the illustrative embodiment.
Figure 2G:
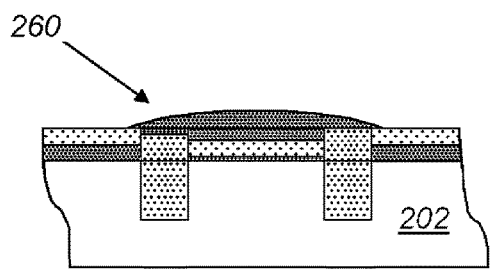
FIG. 2G is a schematic diagram of the resulting structure after another step is performed in the fabrication of the IR detector, in which a graphene layer is deposited, according to the illustrative embodiment.
Figure 2H:
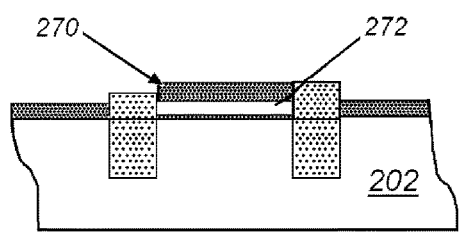
FIG. 2H is a schematic diagram of the resulting IR detector after the final step is performed in the fabrication of the IR detector, in which the graphene layer is masked off to create the image detector design desired and the amorphous silicon in the cavity is etched, according to the illustrative embodiment.

As shown in FIG. 2C, in the next step of the fabrication process a layer of amorphous silicon 220 is deposited and planarized using chemical-mechanical polishing to result in the amorphous silicon 230 of FIG. 2D. The next step is use standard photolithography techniques using a photoresist stencil and reactive ion etching to etch contacts holes 240 through the amorphous silicon and silicon oxide layers clearing the material down to the underlying tungsten plugs which serve as interconnects to the underlying CMOS circuitry, as shown in FIG. 2E. The next step is to use direct current sputtering to deposit standard CMOS interconnect metallurgy, aluminum-copper thin films 250. Standard photolithographic/dry etch techniques are used to delineate the interconnect structures, as shown in FIG. 2F. The next step, as shown in FIG. 2G, is to deposit graphene layer(s) 260. The final steps are to mask off the graphene fabric and employ standard photolithographic methods to create the image the detector design required. Finally using XeFl2 (Xenon Difluoride) etching, or other techniques known in the art, the amorphous silicon in the cavity is etched and a gap or cavity 272 is created, which results in the fully fabricated device as shown in FIG. 2H having a suspended region of graphene-based fabric 270 overlying the gap 272. Also refer to FIG. 3 for a perspective view of the fully fabricated device.

Figure 7A:
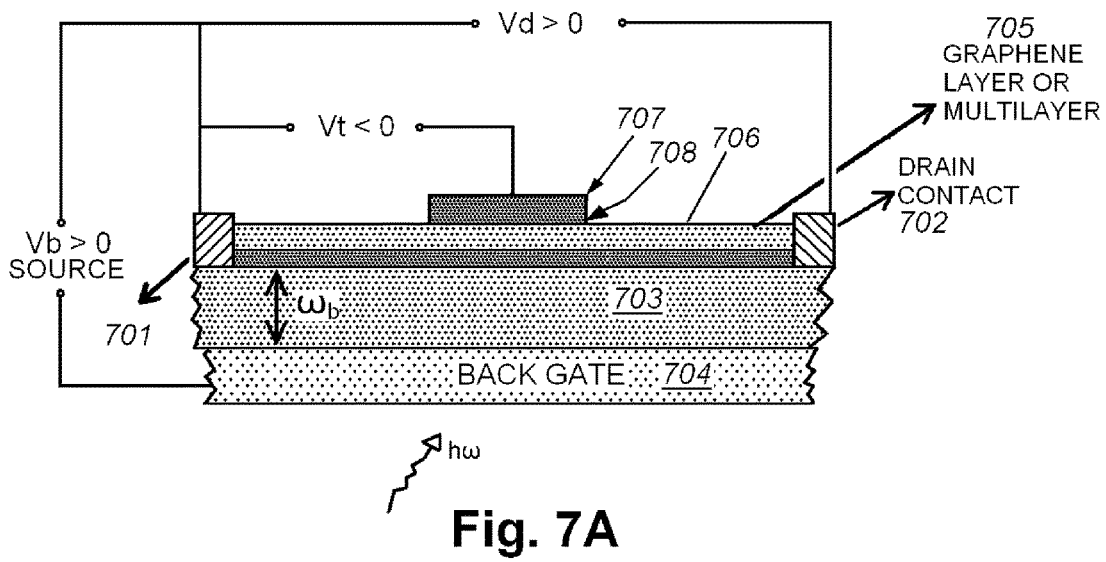
FIG. 7A is a schematic diagram of a photo-field effect transistor device structure incorporating a graphene layer or multilayer, in accordance with the illustrative embodiments.

One indicator for process optimization is to use CNT based field effect transistors (for example as shown in FIG. 7A) and measure the ratio of the current on over the current off. After the optimized space is determined then the process is further optimized by examining the graphene sheets with Transmission Electron Microscope for defects, electronic mobility and degree of CNT rupture.

Figure 3:
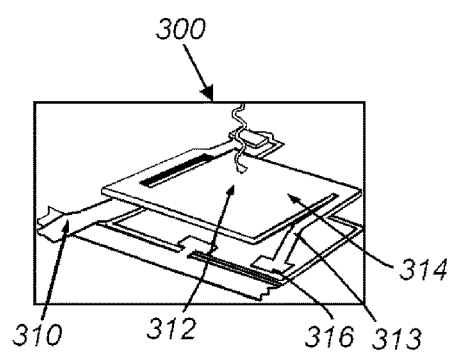
FIG. 3 is a perspective view of the fully assembled graphene based microbolometer using a suspended graphene detecting element, in accordance with an illustrative embodiment.
Figure 4:
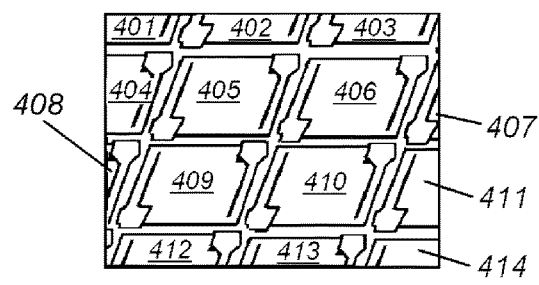
FIG. 4 is a top view of a matrix of graphene based microbolometers or photo field effect transistor arrays comprising a focal plane array, in accordance with the illustrative embodiments.

Reference is now made to FIG. 3, showing a perspective view of a fully assembled graphene based microbolometer, according to an illustrative embodiment. A graphene based microbolometer structure 300 is shown, having readout locations 310. The structure 300 includes a graphene nanoribbon fabric 312 suspended above the substrate 313, in accordance with the techniques described herein and readily apparent to those having ordinary skill. The thermally isolated cantilever structure 314 is also shown, as well as the connection to tungsten (W) plugs 316. An array of graphene nanoribbon based microbolometers is shown in the top view of FIG. 4, in accordance with the illustrative embodiments. The array 400 of microbolometers includes a plurality of microbolometers 401, 402, 403, 404, 405, 406, 407, 408, 409, 410, 411, 412, 413, and 414.

FIG. 5 is a schematic diagram of an exemplary CMOS readout circuit for the graphene nanoribbon IR detector in accordance with the illustrative embodiments. As shown in the diagram 500, there is a common half circuit 510 operatively connected to a unit cell circuit 520 which includes the IR detector 521. A dynamic discharging output stage circuit 530 is operatively connected to the unit cell circuit 520 to define the overall CMOS readout circuit 500.

Figure 6:
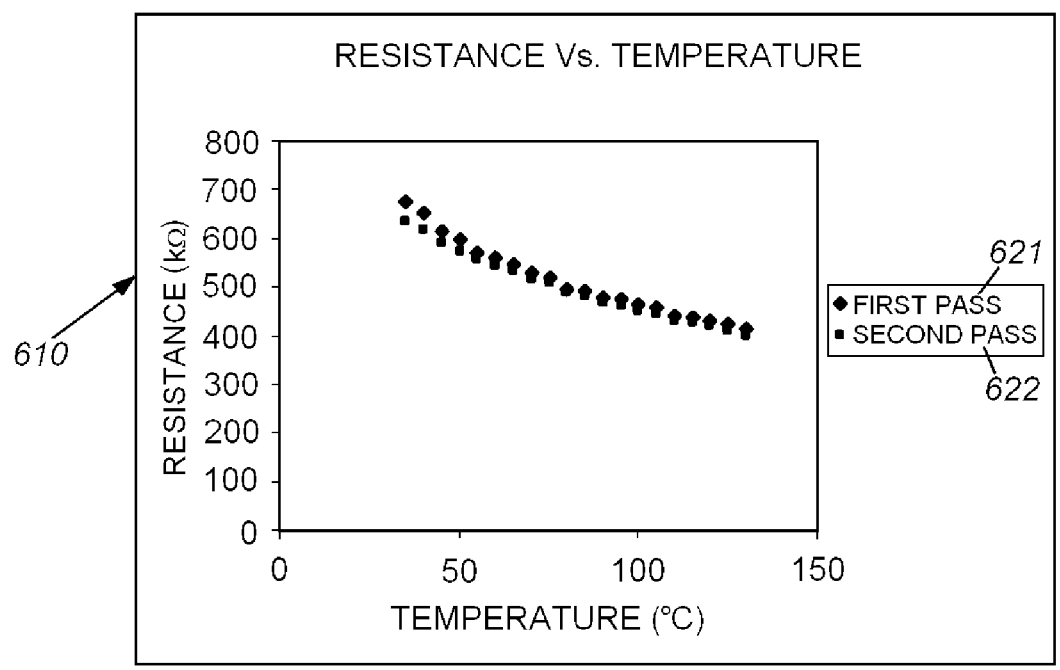
FIG. 6 is a graphical diagram of the measured film resistance of a graphene layer versus temperature, according to the illustrative embodiment.

FIG. 6 is a graphical diagram of the measured film resistance of the graphene layer versus the temperature, according to the illustrative embodiments. As described hereinabove, the electrical resistance of the microbolometers changes as the temperature rises due to the absorption of electromagnetic radiation in the fabric. This is illustrated in the graphical diagram 610 of FIG. 6. As shown, during both the first pass 621 and the second pass 622, as the temperature increases, the resistance of the microbolometer changes. Accordingly, this allows the structure to be employed as an IR detector in accordance with the illustrative embodiments.

Reference is now made to FIG. 7A showing a schematic diagram of a photo-field effect transistor device structure incorporating a graphene layer or multilayer, according to an illustrative embodiment. As shown, the fully assembled IR detector is operatively connected to source and ground where appropriate to provide a photo-field effect transistor. A source 701 and drain contact 702 are deposited and etched onto a silicon oxide layer 703 that is deposited on a substrate 704, such as silicon, GaAs, or other compound semiconductors. Graphene layers 705 are fabricated and deposited on the silicon oxide layer 703. The next step is to expose the graphene layers to an oxidation environment at sufficient temperature. Each layer is then exposed to a dopant either n-type of p-type and then the next graphene layer is exposed to the opposite dopant type creating a n-on-p or p-on-n structure. A CMOS compatible thin film metal 706 is then deposited, such as palladium or platinum, upon which the source and drain contacts 701, 702 are fabricated.

A metal or oxide gate electrode 707 is fabricated on top of the graphene layer or layers. The gate electrode 707 can comprise a deposited metal of SiO2, which modulates the current flow across the phototransistor detector. In some embodiments, it may be necessary to fabricate a space 708 between the top of the graphene and the bottom of the metal or silicon oxide gate electrode.

Figure 7B:
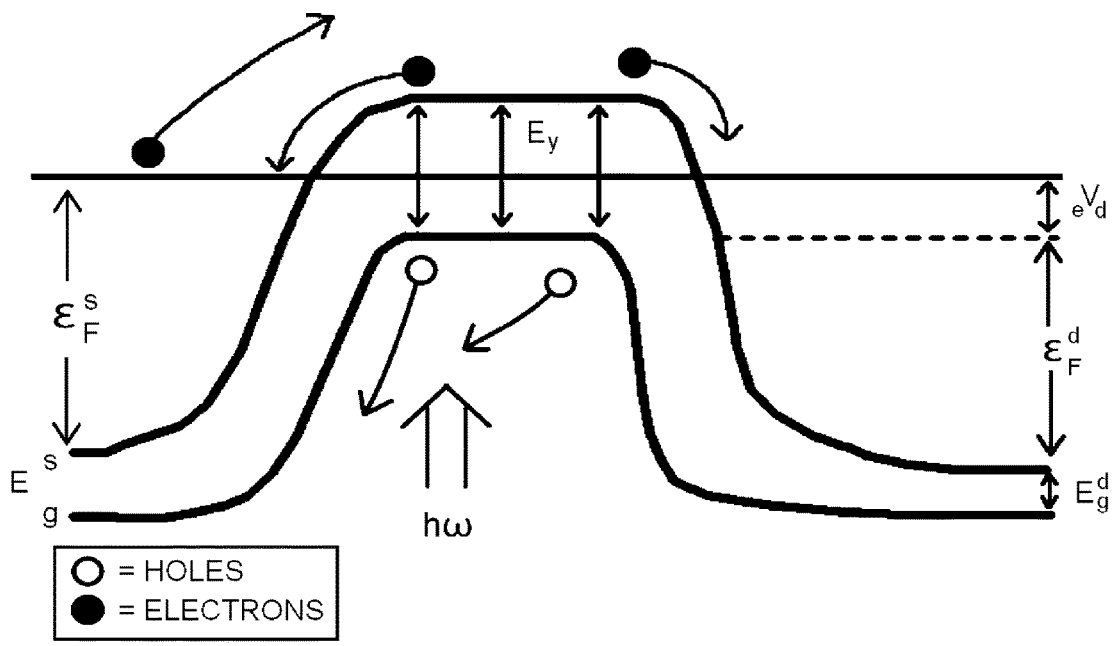
FIG. 7B is a band gap diagram of the structure of FIG. 7A, according to the illustrative embodiments.

FIG. 7B shows a band gap diagram of the photo-field effect transistor of FIG. 7A. As shown, with the initiation of photon illumination, electrons move either towards the Vd level or into the conduction band. Holes move toward the Vg level, thereby creating a depletion region in the p-n junction.

The various illustrative embodiments afford efficient thermal detectors by employing graphene layers. Oxidation of the graphene results in semiconducting behavior and, with the addition of a n-type or p-type dopant, results in either n-on-p or p-on-n diode devices with very high mobility. This results in high sensitivity and fast detector response operation. The resulting devices can be optimized for detection of UV and Terahertz radiation, in accordance with the illustrative embodiments.

The teachings herein can be embodied in other specific forms without departing from the spirit or essential characteristics thereof. The present embodiments are therefore to be considered illustrative and not restrictive, the scope of the invention being indicated by the appended claims rather than by the foregoing description.

The foregoing has been a detailed description of illustrative embodiments of the invention. Various modifications and additions can be made without departing from the spirit and scope of this invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. For example, the illustrative embodiments can include additional layers to perform further functions or enhance existing, described functions. Likewise, the electrical connectivity of the cell structure with other cells in an array and/or an external conduit is expressly contemplated and highly variable within ordinary skill. Additionally, it is expressly contemplated that single-wall nanotubes, multi-wall nanotubes, and any combination thereof, can be employed. More generally, while some ranges of layer thickness and illustrative materials are described herein, these ranges are highly variable. It is expressly contemplated that additional layers, layers having differing thicknesses and/or material choices can be provided to achieve the functional advantages described herein. In addition, directional and locational terms such as "top," "bottom," "center," "front," "back," "on," "under," "above," and "below" should be taken as relative conventions only, and are not absolute. Furthermore, it is expressly contemplated that various semiconductor and thin film fabrication techniques can be employed to form the structures described herein. Accordingly, this description is meant to be taken only by way of example, and not to otherwise limit the scope of this invention.

What is claimed is:

1. A graphene based detector comprising:
    a thin film of graphene suspended between electrical contacts;
    first and second conductive terminals in electrical communication with the thin film of graphene;
    wherein the thin film of graphene is tuned such that exposure of radiation induces a change in impedance between the first and second conductive terminals which is sensed by CMOS readout circuitry;
    wherein the thin film of graphene nanoribbon is tuned to increase the sensitivity of the detector by exposing the graphene nanoribbon to an oxidation environment at a predetermined temperature, which thereby increases the thermal coefficient of resistance (TCR) to excess of 4 percent per degree centigrade and up to 6 percent per degree centigrade, thereby resulting in a Noise Equivalent Delta Temperature (NEDT) of less than 10 mK.

2. The graphene based detector of claim 1 further comprising sensing circuitry for detecting changes in input impedance using the CMOS readout circuitry.

3. The graphene based detector of claim 1 wherein the thin film of graphene is tuned to be sensitive to Infrared (IR) radiation in the micron band of 1 to 12 microns and the radiation that induces the change in impedance comprises IR radiation.

4. The graphene based detector of claim 1 wherein the thin film of graphene is tuned to be responsive to a selected functionalization molecular species, to achieve responsivity to Ultraviolet (UV) or Terahertz (THZ) radiation.

5. The graphene based detector of claim 1 wherein the thin film of graphene is deposited on a substrate having an insulating layer comprised of dielectric material with a cantilever beam composed of silicon nitride, which is suspended over a channel, thereby providing thermal isolation from surrounding environments.

6. The graphene based detector of claim 1 wherein the thin film of graphene is deposited on vanadium oxide and amorphous silicon to assist in the improvement of photon absorption.

7. The graphene based detector of claim 1 wherein the first and second conductive terminals comprise one of: palladium and platinum, thereby enhancing the pi bonding to the thin film of graphene and reducing contact resistance.

8. The graphene based detector of claim 1 wherein the thin film of graphene is optimized for wavelength absorption by use of functionalization molecules or nanoparticles tuned to a predetermined wavelength.

9. A graphene based detector comprising:
a thin film of graphene suspended between electrical contacts;
first and second conductive terminals in electrical communication with the thin film of graphene;
wherein the thin film of graphene is tuned such that exposure of radiation induces a change in impedance between the first and second conductive terminals;
wherein the thin film of graphene nanoribbon is tuned to increase the sensitivity of the detector by exposing the graphene nanoribbon to an oxidation environment at a predetermined temperature, which thereby increases the thermal coefficient of resistance (TCR) to excess of 4 percent per degree centigrade and up to 6 percent per degree centigrade, thereby resulting in a Noise Equivalent Delta Temperature (NEDT) of less than 10 mK.

10. The graphene based detector of claim 9 further comprising sensing circuitry for detecting changes in input impedance using the CMOS readout circuitry.

11. The graphene based detector of claim 9 wherein the thin film of graphene is tuned to be sensitive to Infrared (IR) radiation in the micron band of 1 to 12 microns and the radiation that induces the change in impedance comprises IR radiation.

12. The graphene based detector of claim 9 wherein the thin film of graphene is tuned to be responsive to a selected functionalization molecular species, to achieve responsivity to Ultraviolet (UV) or Terahertz (THZ) radiation.

13. The graphene based detector of claim 9 wherein the thin film of graphene is deposited on a substrate having an insulating layer comprised of dielectric material with a cantilever beam composed of silicon nitride, which is suspended over a channel, thereby providing thermal isolation from surrounding environments.

14. The graphene based detector of claim 9 wherein the thin film of graphene is deposited on vanadium oxide and amorphous silicon to assist in the improvement of photon absorption.

15. The graphene based detector of claim 9 wherein the first and second conductive terminals comprise one of: palladium and platinum, thereby enhancing the pi bonding to the thin film of graphene and reducing contact resistance.

16. The graphene based detector of claim 9 wherein the thin film of graphene is optimized for wavelength absorption by use of functionalization molecules or nanoparticles tuned to a predetermined wavelength.

\* \* \* \* \*